United States Patent
Daubenspeck et al.

(10) Patent No.: US 7,112,470 B2
(45) Date of Patent: Sep. 26, 2006

(54) CHIP DICING

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, CA (US)

( * ) Notice: Subject to any disclaimer, the term of this patent is extended or adjusted under 35 U.S.C. 154(b) by 0 days.

(21) Appl. No.: 10/711,383

(22) Filed: Sep. 15, 2004

(65) Prior Publication Data

US 2006/0057822 A1   Mar. 16, 2006

(51) Int. Cl.
*H01L 21/48* (2006.01)

(52) U.S. Cl. ............... 438/113; 438/114; 257/E21.599

(58) Field of Classification Search ............... 438/113, 438/114; 257/E21.599
See application file for complete search history.

(56) References Cited

U.S. PATENT DOCUMENTS

| 4,259,682 | A | 3/1981 | Gamo |
| 5,543,365 | A | 8/1996 | Wills et al. |
| 6,399,463 | B1 | 6/2002 | Glenn et al. |
| 6,555,447 | B1 | 4/2003 | Weishauss et al. |
| 6,611,050 | B1* | 8/2003 | Ference et al. ............... 257/679 |
| 6,903,016 | B1* | 6/2005 | Cohen ............... 438/687 |
| 6,958,312 | B1* | 10/2005 | Chae et al. ............... 510/176 |
| 2003/0047543 | A1 | 3/2003 | Peng et al. |
| 2003/0060024 | A1 | 3/2003 | Imori |
| 2003/0143819 | A1 | 7/2003 | Hedler et al. |
| 2003/0190795 | A1* | 10/2003 | Kawakami ............... 438/462 |
| 2003/0211707 | A1 | 11/2003 | Brouillette et al. |
| 2004/0137701 | A1* | 7/2004 | Takao ............... 438/461 |

FOREIGN PATENT DOCUMENTS

| JP | 4118190 A | 4/1992 |
| JP | 6163687 A | 6/1994 |

OTHER PUBLICATIONS

"Two-Pass Laser Cutting", by A. S. Shah et al., IBM Technical Disclosure Bulletin, vol. 16, No. 10, Mar. 1974.

* cited by examiner

*Primary Examiner*—Trung Dang
(74) *Attorney, Agent, or Firm*—Schmeiser, Olsen & Watts; William D. Sabo

(57) ABSTRACT

A semiconductor structure and method for chip dicing. The method comprises the steps of (a) providing a semiconductor substrate; (b) forming first and second device regions of first and second chips, respectively, in and at top of the semiconductor substrate, wherein the first and second chips are separated by a semiconductor border region of the semiconductor substrate; (c) forming N interconnect layers directly above the semiconductor border region and the first and second device regions, wherein N is a positive integer, wherein each layer of the N interconnect layers comprises an etchable portion directly above the semiconductor border region, and wherein the etchable portions of the N interconnect layers form a continuous etchable block; (d) removing the continuous etchable block by etching; and (e) cutting with a laser through the semiconductor border region via an empty space of the removed continuous etchable block to separate the first and second chips.

10 Claims, 5 Drawing Sheets

CHIP DICING

BACKGROUND OF THE INVENTION

1. Technical Field

The present invention relates to chip dicing, and more particularly, to a chip separation method using a laser.

2. Related Art

Chip dicing is the process of separating individual chips from a wafer. Typically, chip dicing involves the use of a saw blade, chemicals, a laser, or their combination to cut through and along kerf regions (dicing channels) that run between the chips of the wafer.

A saw blade can cut through the dicing channels at a high speed. However, because each of the dicing channels must be wider than the width of the saw blade (which is typically 100 μm), a large wafer area must be used for chip dicing, which is undesirable.

The dicing channels usually comprise test circuits used to test the functionality of the chips. If chemicals are used to etch through the dicing channels, different chemicals and steps must be used to etch through different materials of the test circuits which reside in the dicing channels. As a result, the dicing process becomes time consuming and expensive.

A laser can make a narrower cut (typically 10 μm wide) through the dicing channels than a saw blade. However, the cutting speed of the laser is usually slow compared to the cutting speed of a saw blade.

In short, each of the cutting means for chip dicing described above has advantages and disadvantages. Therefore, there is a need for a novel structure and chip dicing method that uses an optimum combination of these cutting means for chip dicing.

SUMMARY OF THE INVENTION

The present invention provides a method for chip separation, the method comprising the steps of (a) providing a semiconductor substrate; (b) forming first and second device regions in and at top of the semiconductor substrate, wherein the first and second device regions are separated by a semiconductor border region of the semiconductor substrate; (c) forming N interconnect layers directly above the semiconductor border region and the first and second device regions, wherein N is a positive integer, wherein each layer of the N interconnect layers comprises an etchable portion directly above the semiconductor border region, and wherein the etchable portions of the N interconnect layers form a continuous etchable block directly above the semiconductor border region; (d) removing the continuous etchable block by etching; and (e) cutting with a laser through the semiconductor border region via an empty space of the removed continuous etchable block.

The present invention also provides method for chip separation, the method comprising the steps of (a) providing a semiconductor substrate; (b) forming first and second device regions and a filled deep trench in and at top of the semiconductor substrate, wherein the first and second device regions are separated by a semiconductor border region of the semiconductor substrate, and wherein the semiconductor border region comprises the filled deep trench; (c) forming N interconnect layers directly above the border region and the first and second device regions, wherein N is a positive integer, wherein each layer of the N interconnect layers comprises an etchable portion directly above the filled deep trench, and wherein the etchable portions of the N interconnect layers form a continuous etchable block directly above the filled deep trench; (d) removing the continuous etchable block by etching; and (e) cutting with a laser through the filled deep trench via an empty space of the removed continuous etchable block.

The present invention also provides a semiconductor structure, comprising (a) first and second device regions in and at top of a semiconductor substrate, wherein the first and second device regions are separated by a semiconductor border region of the semiconductor substrate; and (b) N interconnect layers directly above the border region and the first and second device regions, wherein N is a positive integer, wherein each layer of the N interconnect layers comprises an etchable portion directly above the semiconductor border region, and wherein the etchable portions of the N interconnect layers form a continuous etchable block directly above the semiconductor border region.

The present invention provides a novel structure and chip dicing method that uses an optimum combination of these cutting means for chip dicing.

DETAILED DESCRIPTION OF THE INVENTION

Figure 1A:
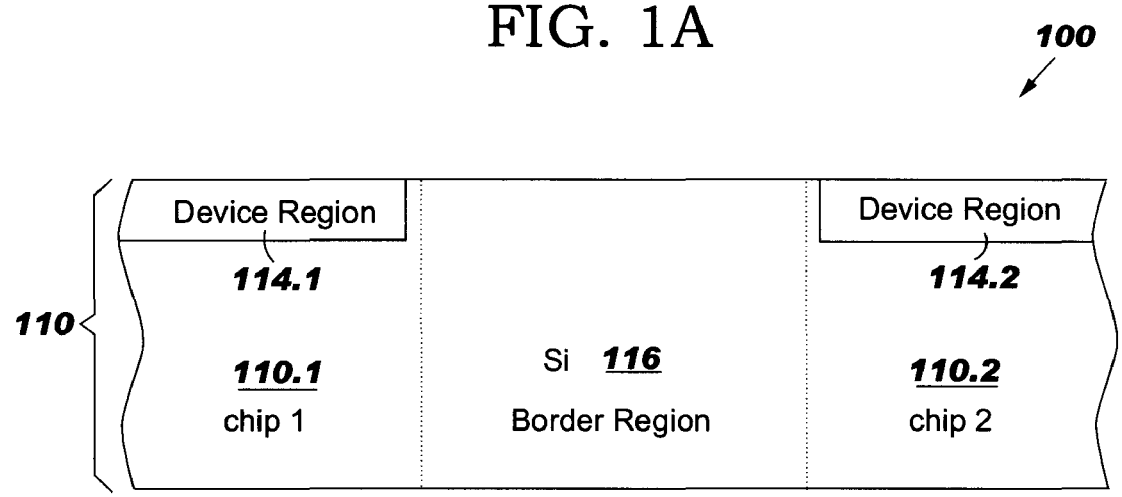
FIGS. 1A–1E show cross-sectional views of a semiconductor structure 100 used to illustrate a first fabrication and dicing method, in accordance with embodiments of the present invention.

FIGS. 1A–1E show cross-sectional views of a semiconductor structure 100 used to illustrate a first fabrication and dicing method, in accordance with embodiments of the present invention. More specifically, with reference to FIG. 1A, in one embodiment, the first fabrication and dicing method starts with the step of providing a semiconductor (e.g., silicon, germanium, etc.) substrate 110. Next, device regions 114.1 and 114.2 (for illustration, only two are shown) are formed in and at top of the semiconductor substrate 110. In one embodiment, the device regions 114.1 and 114.2 can comprise devices such as transistors, resistors, capacitors, and electrically insulating regions. The device regions 114.1 and 114.2 can be parts of chips 110.1 and 110.2, respectively. The region 116 of the semiconductor substrate 110 sandwiched between the chips 110.1 and 110.2 can be referred to as the semiconductor border region 116, which serves as a border between the chips 110.1 and 110.2 and will be cut through later (described infra) during chip dicing so as to separate the chips 110.1 and 110.2 from each other.

Figure 1B:
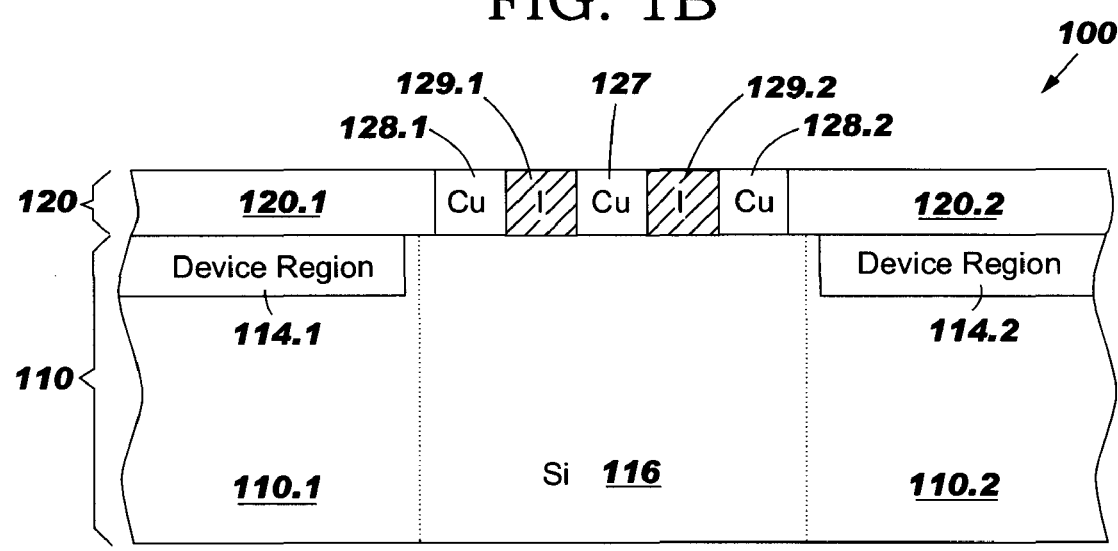

Next, with reference to FIG. 1B, in one embodiment, the first fabrication and dicing method proceeds with the step of forming a first interconnect layer 120 (comprising regions 120.1, 120.2, and 126) on top of the semiconductor border region 116 and the device regions 114.1 and 114.2. In one embodiment, the regions 120.1 and 120.2, which are directly above the device regions 114.1 and 114.2, respectively, can comprise interconnect elements such as electrically conducting wires (e.g., copper, aluminum wires) and electrically insulating regions (not shown) so as to electrically connect different devices (not shown) within the respective device regions 114.1 and 114.2.

The region 126, which is directly above the semiconductor border region 116, can comprise an etchable portion 127, chip edge portions 128.1 and 128.2, and isolation portions 129.1 and 129.2. In one embodiment, the etchable portion 127 can comprise a material that can be etched away using etching (preferably, wet etching). For instance, the etchable portion 127 can comprise copper. In one embodiment, the chip edge portions 128.1 and 128.2 can comprise any material that is adapted for preventing cracking from propagating through it. In one embodiment, the chip edge portions 128.1 and 128.2 can comprise copper (the same material as the etchable portion 127 to make fabrication process simple). In general, the etchable portion 127 and the chip edge portions 128.1 and 128.2 do not have to comprise the same material. In one embodiment, the isolation portions 129.1 and 129.2 can comprise a low-k material (i.e., k<3.5), wherein k denotes a dielectric constant.

Figure 1C:
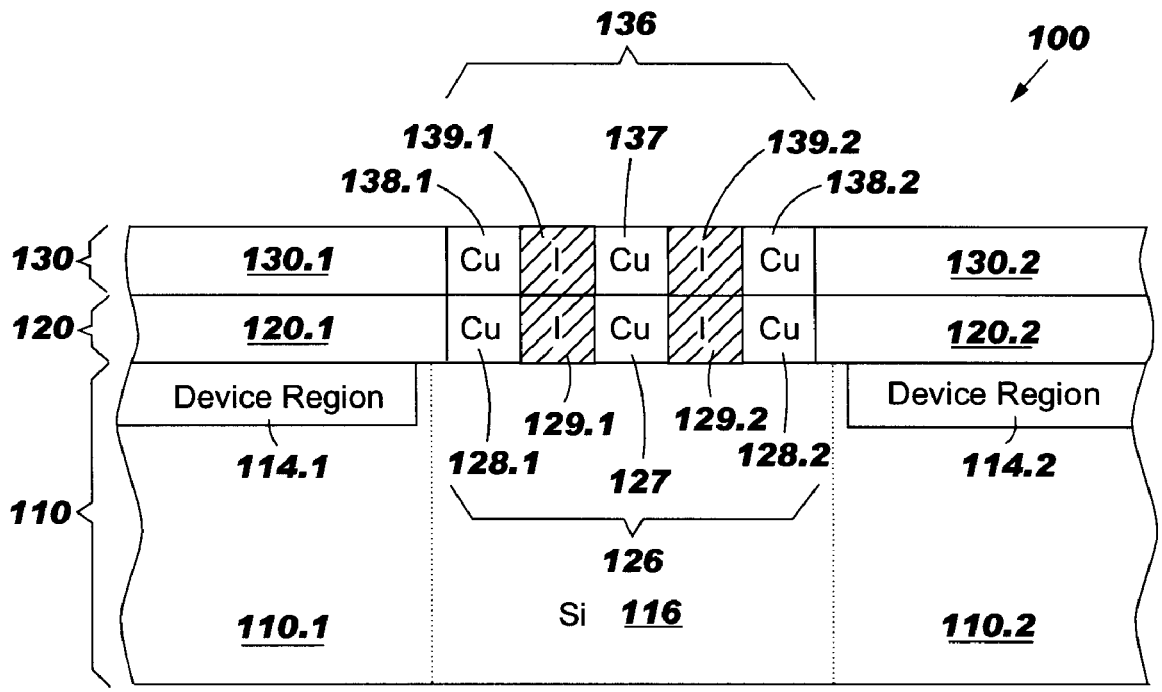

Next, with reference to FIG. 1C, in one embodiment, the first fabrication and dicing method proceeds with the step of forming a second interconnect layer 130 (comprising regions 130.1, 130.2, and 136) on top of the first interconnect layer 120. The second interconnect layer 130 can be similar to the first interconnect layer 120. More specifically, in one embodiment, the regions 130.1 and 130.2, which are directly above the device regions 114.1 and 114.2, respectively, can comprise interconnect elements such as electrically conducting wires (e.g., copper, aluminum wires) and electrically insulating regions (not shown) so as to electrically connect different devices (not shown) within the device regions 114.1 and 114.2.

The region 136, which is directly above the semiconductor border region 116, can comprise an etchable portion 137, chip edge portions 138.1 and 138.2, and isolation portions 139.1 and 139.2. In one embodiment, the etchable portion 137 can comprise a material that can be etched away using etching (preferably, wet etching). For instance, the etchable portion 137 can comprise copper. In one embodiment, the chip edge portions 138.1 and 138.2 can comprise any material that is adapted for preventing cracking from propagating through it. In one embodiment, the chip edge portions 138.1 and 138.2 can comprise copper (the same material as the etchable portion 137 to make fabrication simple). In general, the etchable portion 137 and the chip edge portions 138.1 and 138.2 do not have to comprise the same material. In one embodiment, the isolation portions 139.1 and 139.2 can comprise a low-k material (i.e., k<3.5).

In one embodiment, the etchable portions 127 and 137 form a continuous etchable block 127, 137 directly above the semiconductor border region 116. The continuous etchable block 127, 137 can be considered a dicing channel (or kerf) region which is to be cut through later so as to separate the chips 110.1 and 110.2. In FIG. 1C, for illustration, two interconnect layers 120 and 130 are shown. In general, N interconnect layers (N is a positive integer) can be formed on top of the semiconductor border region 116 and the device regions 114.1 and 114.2 such that the etchable portions of the N interconnect layers form a continuous etchable block directly above the semiconductor border region 116.

In one embodiment, the chip edge portions 128.1 and 138.1 form a first continuous chip edge block 128.1, 138.1 directly above the semiconductor border region 116. Similarly, the chip edge portions 128.2 and 138.2 form a second continuous chip edge block 128.2, 138.2 directly above the semiconductor border region 116. In one embodiment, the isolation portions 129.1 and 139.1 form a first continuous isolation block 129.1, 139.1. Similarly, the isolation portions 129.2 and 139.2 form a second continuous isolation block 129.2, 139.2.

Figure 1D:
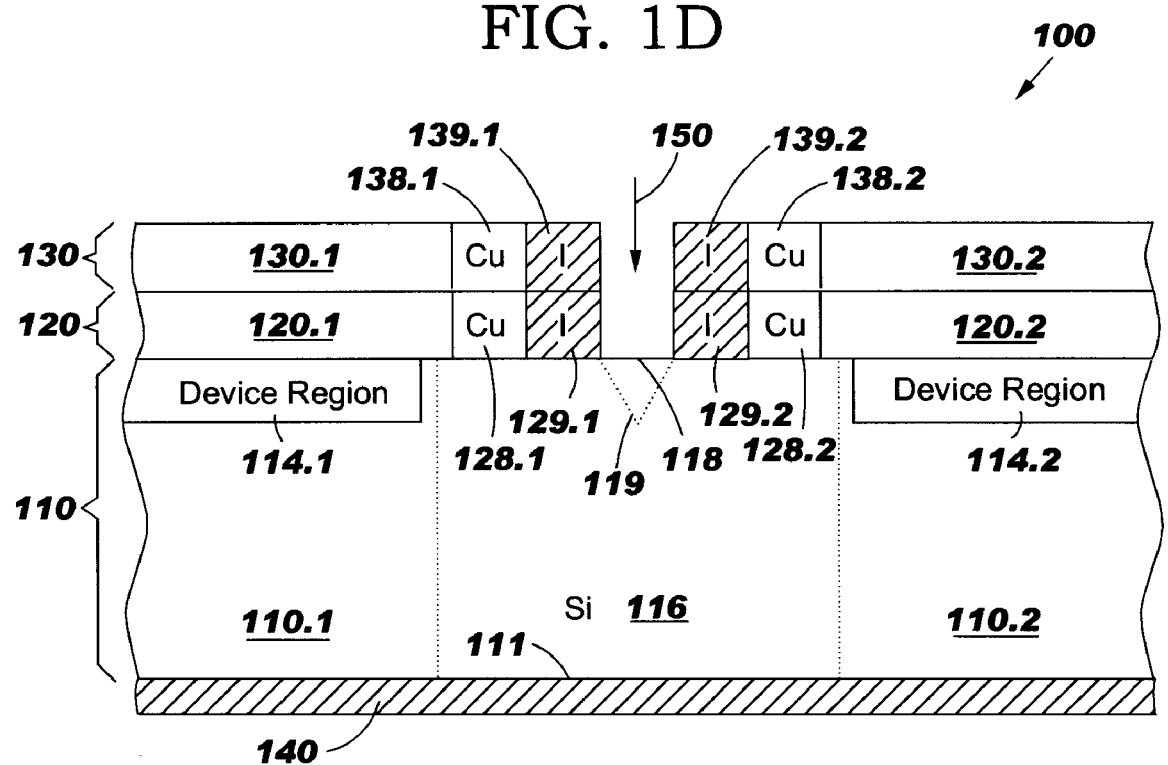

Next, with reference to FIG. 1D, in one embodiment, the first fabrication and dicing method proceeds with the step of applying an adhesive dicing tape 140 to a back surface 111 of the substrate 110. In an alternative embodiment, before the step of applying the adhesive dicing tape 140, the back surface 111 of the substrate 110 can be grinded to reduce the thickness of the substrate 110. Next, a removal step represented by an arrow 150 (hereinafter, referred to as the removal step 150) can be performed to remove the continuous etchable block 127, 137. In one embodiment, the removal step 150 can comprise the steps of masking (i.e., covering the regions not to be removed with a mask) and then wet etching the continuous etchable block 127, 137. As an alternative to the wet etching step above, a dry etching step (e.g., using fluorine-based reactive ion etching) can be used to etch away the continuous etchable block 127, 137. In one embodiment, the removal step 150 is performed until a surface 118 of the semiconductor border region 116 is exposed to the atmosphere.

In one embodiment, the first and second continuous isolation block 129.1, 139.1 and 129.2, 139.2 comprise a material that is essentially not affected by the removal step 150. As a result, the first and second continuous isolation block 129.1, 139.1 and 129.2, 139.2 prevents the removal step 150 from damaging the first and second continuous chip edge blocks 128.1, 138.1 and 128.2, 138.2, respectively.

Next, in one embodiment, the substrate 110 comprises bulk silicon. Then, after the removal step 150 is performed, a second wet etching step (using, illustratively, $HF-HNO_3$), as opposed to the first etching step of the removal step 150, is performed to form a V-shaped trench 119 (dotted line) in the semiconductor border region 116. The V-shaped trench 119 is formed because the second etching step attacks the <111> silicon plane more slowly than other planes. The V-shaped trench 119 serves as a stress concentrator an ensuing cutting step (FIG. 1E) described infra.

Figure 1E:
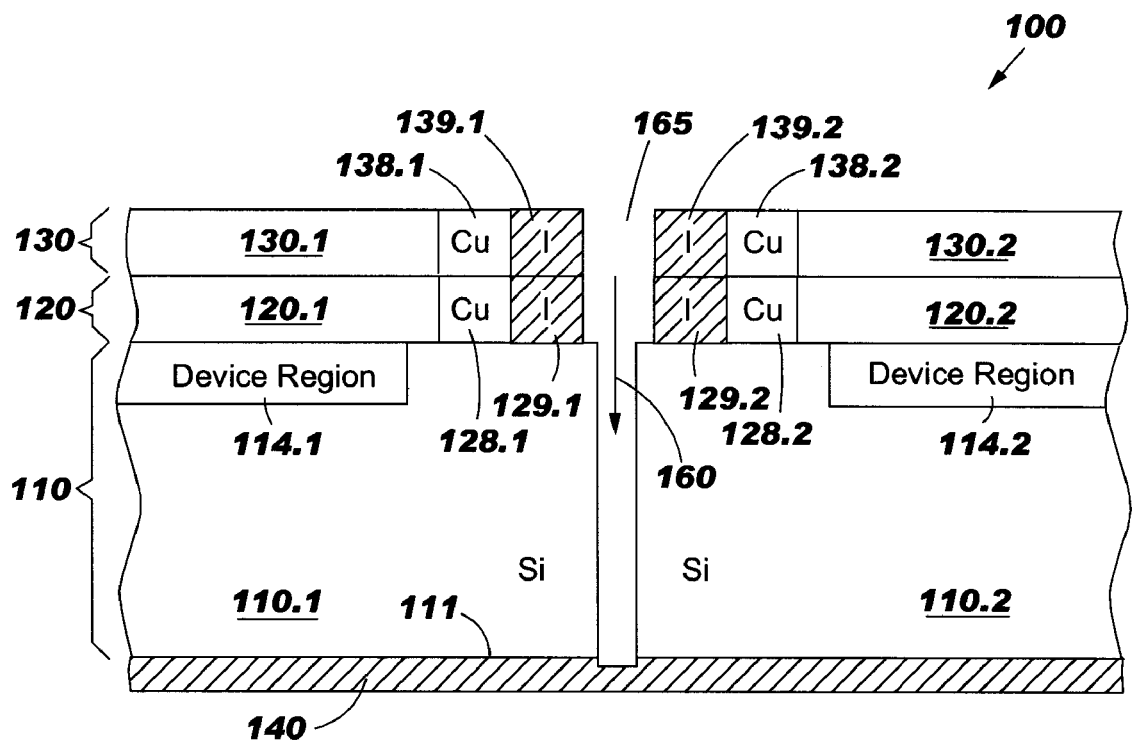

Next, with reference to FIG. 1E, in one embodiment, the first fabrication and dicing method proceeds with a cutting step represented by an arrow 160 (hereinafter, referred to as the cutting step 160) to cut down through the semiconductor border region 116. In one embodiment, the cutting step 160 can comprise the use of a laser via an empty space 165 of the removed continuous etchable block 127, 137 (FIG. 1C) to cut down through the semiconductor border region 116. As a result, the chips 110.1 and 110.2 are separated from each other. In general, this first fabrication and dicing method describe supra can be used to separate any number of chips on a wafer.

In one embodiment, the laser used in the cutting step 160 can be adapted for cutting through the semiconductor material of the semiconductor border region 116 while causing essentially no damage to the chip edge blocks 128.1, 138.1 and 128.2, 138.2.

The first continuous chip edge block 128.1, 138.1 protects the chip 110.1. More specifically, the first continuous chip edge block 128.1, 138.1 prevents any cracks (if any) caused by the cutting step 160 (FIG. 1E) to the isolation regions 129.1 and 139.1 from propagating through it towards the interconnect regions 120.1 and 130.1 of the chip 110.1. Similarly, the second continuous chip edge block 128.2, 138.2 protects the chip 110.2. More specifically, the second continuous chip edge block 128.2, 138.2 prevents any cracks (if any) caused by the cutting step 160 (FIG. 1D) to the isolation regions 129.2 and 139.2 from propagating through it towards the interconnect regions 120.2 and 130.2 of the chip 110.2.

Figure 2A:
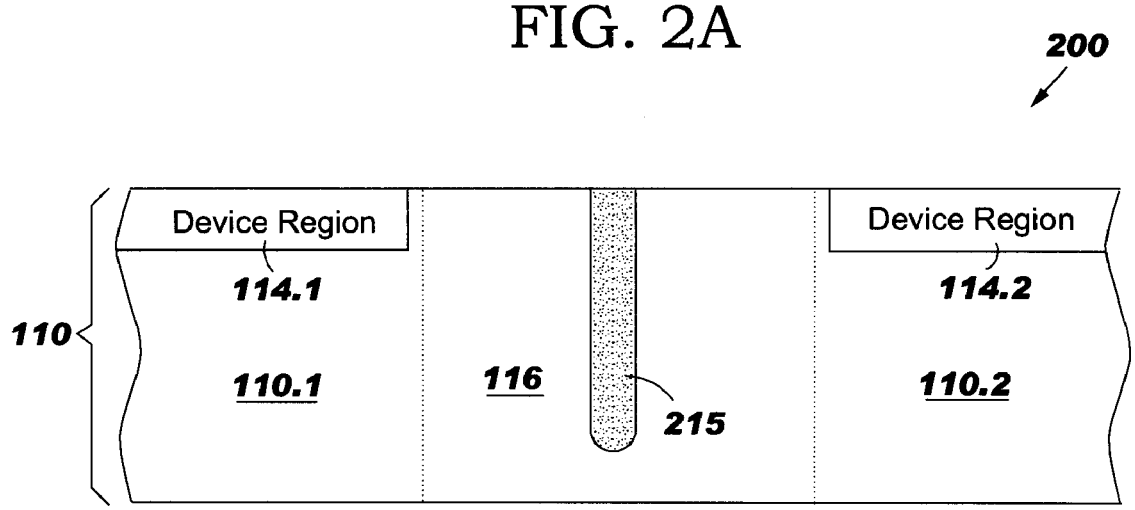
FIGS. 2A–2D show cross-sectional views of another semiconductor structure 200 used to illustrate a second fabrication and dicing method, in accordance with embodiments of the present invention.
Figure 2B:
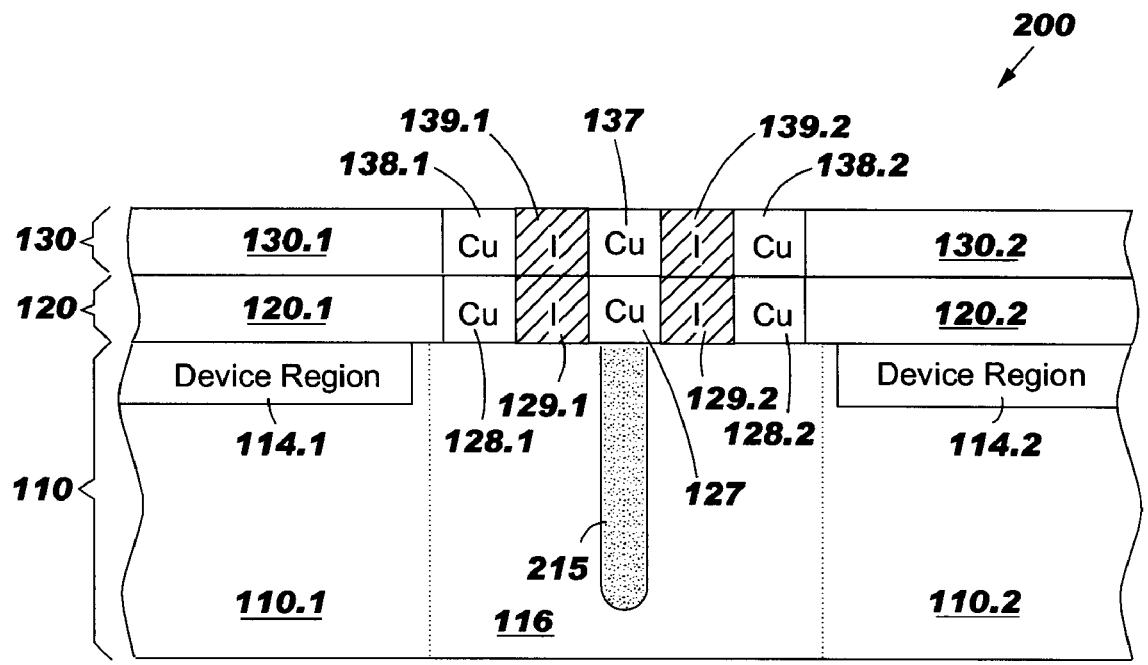
Figure 2C:
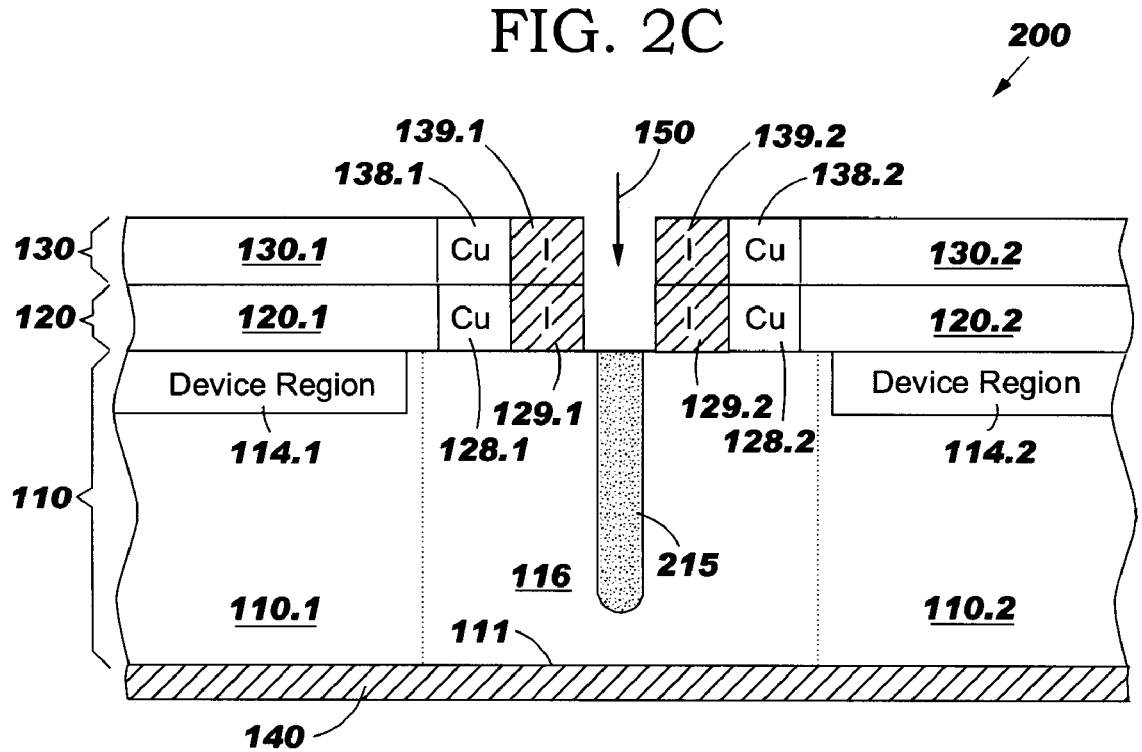
Figure 2D:
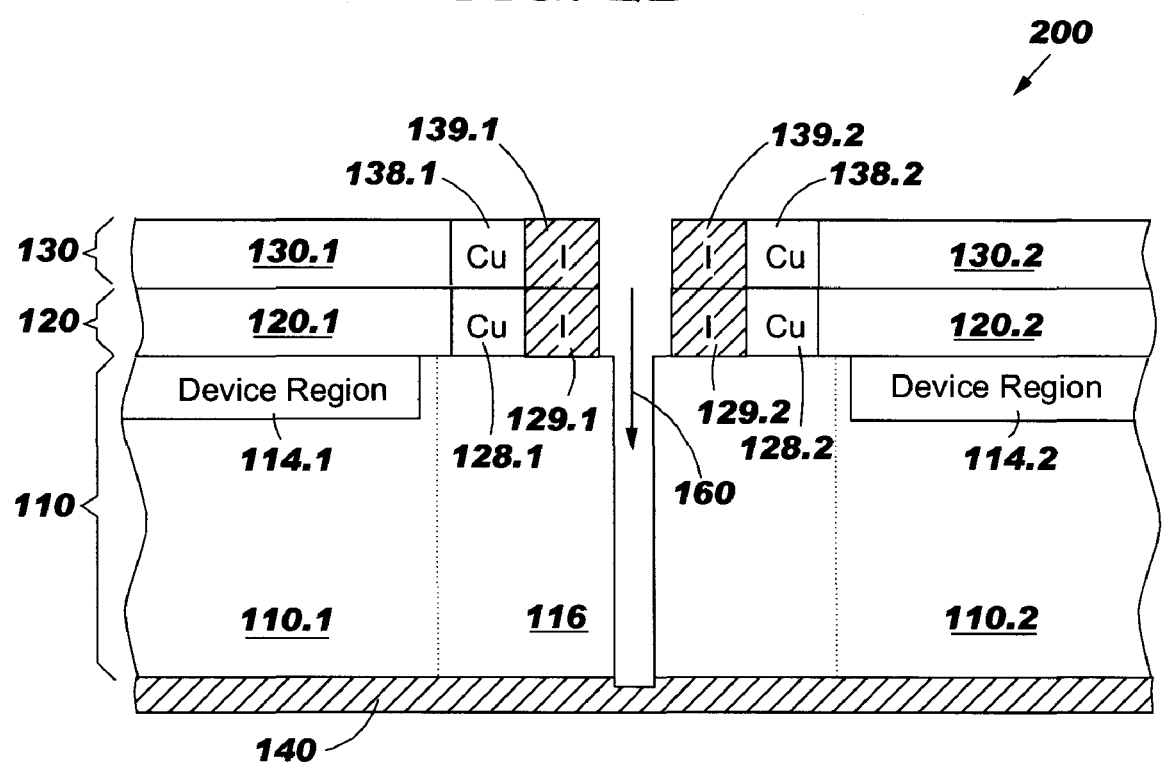

FIGS. 2A–2D show cross-sectional views of another semiconductor structure 200 used to illustrate a second fabrication and dicing method, in accordance with embodiments of the present invention. The second fabrication and dicing method is similar to the first fabrication and dicing method described supra, except that a filled deep trench 215 is formed (by, illustratively, etching the deep trench and then filling it with a material) during the formation of the device regions 114.1 and 114.2 of the chips 110.1 and 110.2, respectively (FIG. 2A). Then, similar to the first fabrication and dicing method, the second fabrication and dicing method comprises the formation of the interconnect layers 120 and 130 (FIG. 2B), the removal step 150 (FIG. 2C), and the cutting step 160 (FIG. 2D).

In one embodiment, the material of the filled deep trench 215 is selected such that the laser used in the ensuing cutting step 160 (FIG. 2D) can more easily and more speedily cut through the filled deep trench 215. In one embodiment, the filled deep trench 215 can comprise polysilicon or silicon oxide, which can be easily cut through by most lasers.

In one embodiment, with reference to FIG. 2C, before applying the dicing tape 140 to the back surface 111 of the substrate 110, the back surface 111 of the substrate 110 can be grinded until the filled deep trench 215 is exposed to the atmosphere at the back surface 111. Then, the step of applying the dicing tape 140 and then the removal step 150 can be performed.

In summary, the first fabrication and dicing method of the present invention comprises the formation of the continuous etchable block 127, 137 (FIG. 1C) directly above the semiconductor border region 116 during the formation of the interconnect layers 120 and 130. Then, the continuous etchable block 127, 137 is removed by wet etching. Next, a laser is used to cut down through the semiconductor border region 116. The second fabrication and dicing method of the present invention is similar to the first fabrication and dicing method, except that the filled deep trench 215 is formed in and at top of the semiconductor border region 116 during the formation of the device regions 120.1 and 120.2 (FIG. 2A). The material used to fill the deep trench 215 is selected so as to facilitate the ensuing cutting step 160 (FIG. 2D) that cuts down through the filled deep trench 215.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for chip separation, the method comprising the steps of:
   (a) providing a semiconductor substrate;
   (b) forming first and second device regions in and at top of the semiconductor substrate,
      wherein the first and second device regions are separated by a semiconductor border region of the semiconductor substrate;
   (c) forming N interconnect layers, in turn, directly above the semiconductor border region and the first and second device regions,
      wherein N is a positive integer greater than one,
      wherein each layer of the N interconnect layers comprises an etchable portion directly above the semiconductor border region,
      wherein the etchable portions of the N interconnect layers form a continuous etchable block directly above the semiconductor border region, and
      wherein the entire continuous etchable block comprises essentially a same material throughout the entire continuous etchable block;
   (d) removing the continuous etchable block by etching; and
   (e) cutting with a laser through the semiconductor border region via an empty space of the removed continuous etchable block, wherein the continuous etchable block comprises copper.

2. A method for chip separation, the method comprising the steps of:
   (a) providing a semiconductor substrate;
   (b) forming first and second device regions in and at top of the semiconductor substrate,
      wherein the first and second device regions are separated by a semiconductor border region of the semiconductor substrate;
   (c) forming N interconnect layers, in turn, directly above the semiconductor border region and the first and second device regions,
      wherein N is a positive integer greater than one,
      wherein each layer of the N interconnect layers comprises an etchable portion directly above the semiconductor border region,
      wherein the etchable portions of the N interconnect layers form a continuous etchable block directly above the semiconductor border region, and
      wherein the entire continuous etchableblock comprises essentially a same material throughout the entire continuous etchable block;
   (d) removing the continuous etchable block by etching;
   (e) cutting with a laser through the semiconductor border region via an empty space of the removed continuous etchable block;
   (f) back-side grinding a back surface of the semiconductor substrate; and then
   (g) applying a dicing tape to the back surface of the semiconductor substrate before the step of removing the continuous etchable block by etching.

3. A method for chip separation, the method comprising the steps of:
   (a) providing a semiconductor substrate;
   (b) forming first and second device regions in and at top of the semiconductor substrate,
      wherein the first and second device regions are separated by a semiconductor border region of the semiconductor substrate;
   (c) forming N interconnect layers, in turn, directly above the semiconductor border region and the first and second device regions,
      wherein N is a positive integer greater than one,
      wherein each layer of the N interconnect layers comprises an etchable portion directly above the semiconductor border region,
      wherein the etchable portions of the N interconnect layers form a continuous etchable block directly above the semiconductor border region, and
      wherein the entire continuous etchable block comprises essentially a same material;
   (d) removing the continuous etchable block by etching; and
   (e) cutting with a laser through the semiconductor border region via an empty space of the removed continuous etchable block, wherein the semiconductor substrate comprises bulk silicon, and wherein, after the step of removing the continuous etchable block by etching, but before the step of cutting by the laser through the semiconductor border region, the method further comprises the step of wet etching a portion of the semiconductor border region so as to form a V-shaped trench in the semiconductor border region.

4. A method for chip separation, the method comprising the steps of:

(a) providing a semiconductor substrate;

(b) forming first and second device regions in and at top of the semiconductor substrate, wherein the first and second device regions are separated by a semiconductor border region of the semiconductor substrate;

(c) forming N interconnect layers, in turn, directly above the semiconductor border region and the first and second device regions, wherein N is a positive integer greater than one, wherein each layer of the N interconnect layers comprises an etchable portion directly above the semiconductor border region, wherein the etchable portions of the N interconnect layers form a continuous etchable block directly above the semiconductor border region, and wherein the entire continuous etchable block comprises essentially a same material;

(d) removing the continuous etchable block by etching; and (e) cutting with a laser though the semiconductor border region via an empty space of the removed continuous etchable block, wherein each layer of the N interconnect layers further comprises first and second chip edge portions and first and second isolation portions directly above the semiconductor border region, and wherein the first chip edge portions of the N interconnect layers form a first continuous chip edge block directly above the semiconductor border region, wherein the second chip edge portions of the N interconnect layers form a second continuous chip edge block directly above the semiconductor border region, wherein the first isolation portions of the N interconnect layers form a first continuous isolation block directly above the semiconductor border region, wherein the second isolation portions of the N interconnect layers form a second continuous isolation block directly above the semiconductor border region, wherein the continuous etchable block is sandwiched between the first and second continuous isolation blocks, wherein the first continuous isolation block is sandwiched between the continuous etchable block and the first continuous chip edge block, wherein the second continuous isolation block is sandwiched between the continuous etchable block and the second continuous chip edge block, and wherein the first and second isolation portions comprise a material which is essentially not affected by the step of removing the continuous etchable block by etching.

5. The method of claim 4, wherein the first and second continuous chip edge blocks comprise a same material as the continuous etchable block.

6. The method of claim 5, wherein the same material of the first and second continuous chip edge blocks and the continuous etchable block comprises copper.

7. The method of claim 4, wherein the first and second continuous chip edge blocks comprise a material that is essentially not affected by the laser.

8. A method for chip separation, the method comprising the steps of:

(a) providing a semiconductor substrate;

(b) forming first and second device regions and a filled deep trench in and at top of the semiconductor substrate, wherein the first and second device regions are separated by a semiconductor border region of the semiconductor substrate, and wherein the semiconductor border region comprises the filled deep trench;

(c) forming N interconnect layers, in turn, directly above the border region and the first and second device regions, wherein N is a positive integer greater than one, wherein each layer of the N interconnect layers comprises an etchable portion directly above the filled deep trench, wherein the etchable portions of the N interconnect layers form a continuous etchable block directly above the filled deep trench, and wherein the entire continuous etchable block comprises essentially a same material throughout the entire continuous etchable block;

(d) removing the continuous etchable block by etching; and (e) cutting with a laser through the filled deep trench via an empty space of the removed continuous etchable block.

9. The method of claim 8, wherein the filled deep trench comprises a material which can be easily cut through by the laser.

10. The method of claim 8, wherein the filled deep trench comprises a material selected from the group consisting of polysilicon and silicon oxide.

* * * * *